(12) United States Patent
Schmidt (10) Patent No.: US 7,554,072 B2
(45) Date of Patent: Jun. 30, 2009

(54) AMPLIFIER CONFIGURATION WITH NOISE REDUCTION FOR A PHOTODIODE

(75) Inventor: Glen E. Schmidt, Bartlesville, OK (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 0 days.

(21) Appl. No.: 11/224,394

(22) Filed: Sep. 12, 2005

(65) Prior Publication Data

US 2006/0054790 A1    Mar. 16, 2006

Related U.S. Application Data

(60) Provisional application No. 60/609,951, filed on Sep. 15, 2004.

(51) Int. Cl.
*H03F 3/08* (2006.01)
(52) U.S. Cl. .............................. 250/214 A; 250/214 R; 330/308
(58) Field of Classification Search ............. 250/214 A, 250/214 LA, 214 R, 214 AL; 327/109, 158.1, 327/458, 514; 330/308; 399/48, 73
See application file for complete search history.

(56) References Cited

U.S. PATENT DOCUMENTS

| | | | | |
|---|---|---|---|---|
| 4,789,777 A | * | 12/1988 | Takami et al. | 250/214 A |
| 5,410,282 A | * | 4/1995 | Larrick et al. | 330/149 |
| 5,763,873 A | * | 6/1998 | Beck et al. | 250/214 B |
| 6,707,023 B2 | * | 3/2004 | Fong et al. | 250/214 A |
| 6,768,384 B1 | * | 7/2004 | Mohandas et al. | 330/308 |
| 2002/0014444 A1 | * | 2/2002 | Hebrank | 209/511 |
| 2003/0111604 A1 | * | 6/2003 | Quek | 250/338.1 |

OTHER PUBLICATIONS

Jenq, Yih-Chyun, "Measuring Harmonic Distortion and Noise Floor of an A/D Converter Using Spectral Averaging". Dec. 1988. IEEE Transactions on Instrumentation and Measurement, vol. 37, No. 4, pp. 525-528.*

* cited by examiner

*Primary Examiner*—Thanh X Luu
*Assistant Examiner*—Francis M Legasse, Jr.
(74) *Attorney, Agent, or Firm*—Michael J. Wallace (57) ABSTRACT

A system, method, and device for amplifying the signal of a photodiode are provided. The exemplary system may have a photodiode with an amplifier. The amplifier may have an amplifier inverting input, an amplifier non-inverting input, and an amplifier output. A photodiode of the system may have a photodiode anode electrically connected with the amplifier inverting input and a photodiode cathode electrically connected with the amplifier non-inverting input. A gain resistor of the system may couple the amplifier inverting input with the amplifier output. The system may also have a fixed voltage reference electrically connected with the photodiode cathode and the amplifier non-inverting output.

21 Claims, 9 Drawing Sheets

Prior Art

Figure 2

Prior Art

FIG. 7
D2 InGaAs DETECTOR AMPLIFIER
700

FIG. 8 D1 InGaAs DETECTOR AMPLIFIER

FIG. 9
LASER DETECTOR AMPLIFIER
900

US 7,554,072 B2

AMPLIFIER CONFIGURATION WITH NOISE REDUCTION FOR A PHOTODIODE

CROSS REFERENCE TO RELATED APPLICATIONS

This application is related to U.S. Provisional Patent Application No. 60/609,951 filed Sep. 15, 2004 entitled, Technique for Improving the Signal to Noise Ratio of a Photodiode Amplifier with Standard Supply Voltages which is incorporated fully herein by reference.

TECHNICAL FIELD

The present invention relates to a photodiode amplifier and more particularly, to a device, method, and system for photodiode amplification and noise reduction using standard power supply voltages.

BACKGROUND INFORMATION

Photodiodes are used in a variety of applications such as biological and chemical analysis, as well as signal detection in fiber optic communication systems. Electrical noise is a well-documented natural phenomenon that has a variety of contributing independent and dependent sources. As is well known to those skilled in the art, the Signal to Noise Ratio (SNR) is an important determining factor in the quality of such a system. A SNR>>1 is very desirable.

Figure 1:
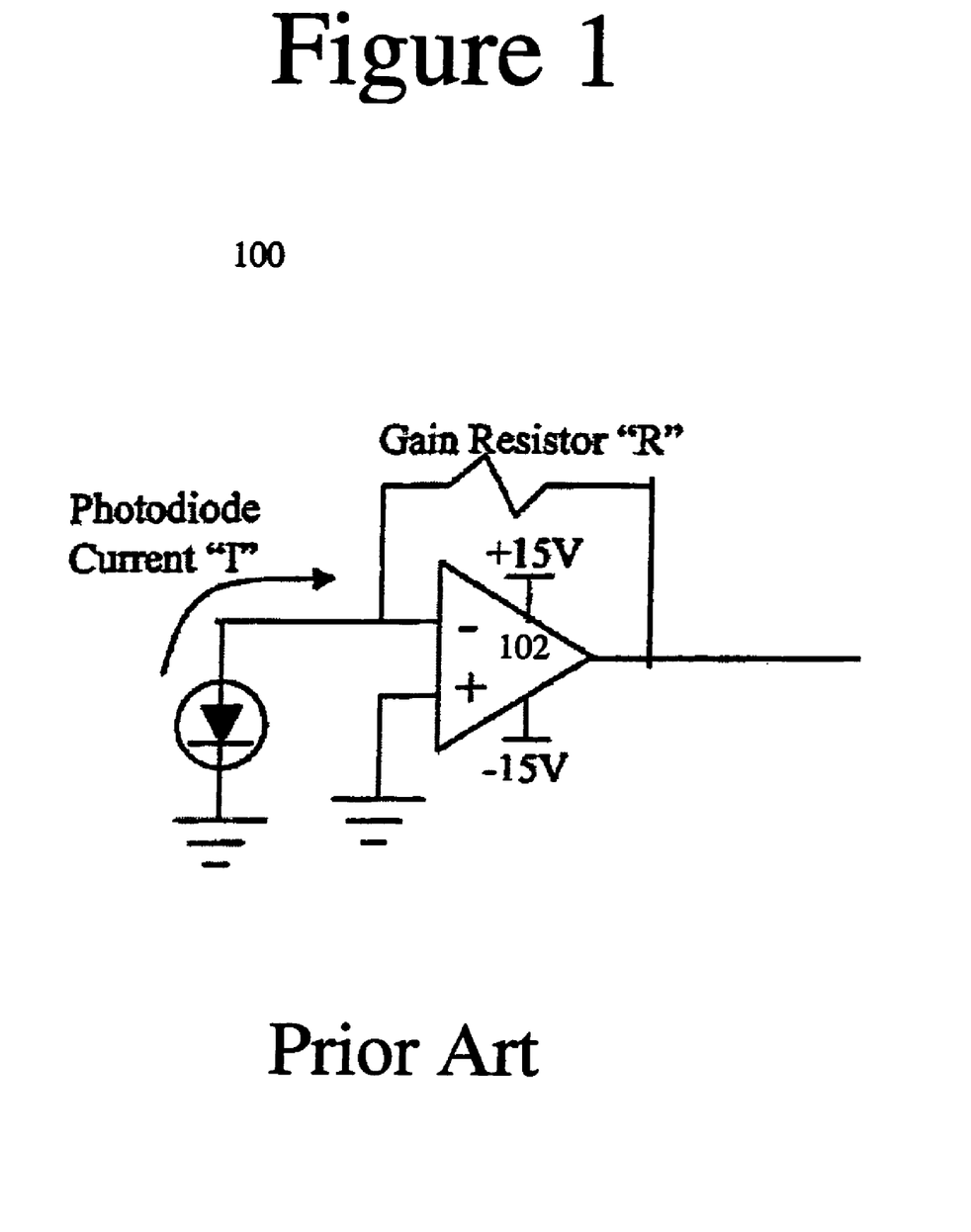
FIG. 1 is a block diagram of a basic photodiode amplification circuit.

Referring to FIG. 1, a photodiode amplification circuit 100 has a very large value of resistance ("R") which for a given gain, produces a better SNR than that of a circuit with a smaller "R" and a subsequent gain stage that creates the same end to end gain. There are several reasons for this, such as the interaction of the photodiode impedances with the amplifier 102. Another notable reason is that of maximized signal amplification while minimizing the thermal noise that is amplified by the amplifier 102.

The Root Mean Square (RMS) thermal noise of the resistor "R" is calculated as:

$\sqrt{(4\,kTR)}$ in nano-volts rms per $\sqrt{(\text{Hertz})}$ where
k=Boltzman's constant=$1.33 \times 10^{23}$
T=Temperature in Kelvin
R=ohms of the gain resistor For room temperature, the equation is simply $\sqrt{((1.6 \times 10E\text{-}20) \times R)}$ Therefore, when R is increased by a factor G, the signal directly increases by G, but the thermal noise only increases by $\sqrt{(G)}$. Since $(R \times G) > \sqrt{(R \times G)}$, large values of G provide $(R \times G) >> \sqrt{(R \times G)}$. If the SNR were viewed as SNR=$(R)/\sqrt{(R)}$, then from a limiting standpoint, the SNR increases as R increases. Therefore, it is very desirable to have "R" as large as possible.

There are secondary reasons for having "R" large, and practical reasons to not have "R" be too large. This is due to additional phenomena dominating when "R" is increased by large multiples. When used in photodiode and electrometer preamplifiers, increasing "R" by factors of several multiples of the shunt impedance of the photodiode can make significant differences in the SNR quality of the system.

Doubling or tripling "R" may cause a respective double or triple change in the output range (or "swing") of the amplifier. Furthermore, a photodiode produces a unidirectional current. Therefore, the signal may only have a single (unidirectional) polarity as it increases. In the circuit of FIG. 1, the amplifier is in an inverting configuration. The output of the amplifier will only go from 0 volts to a negative value. This is due to the photodiode only producing a current that is meaningful in a unipolar fashion. It is important to note that in this case, since the positive amplifier range is unused, one half of the amplifier signal range is wasted or unused.

Figure 2:
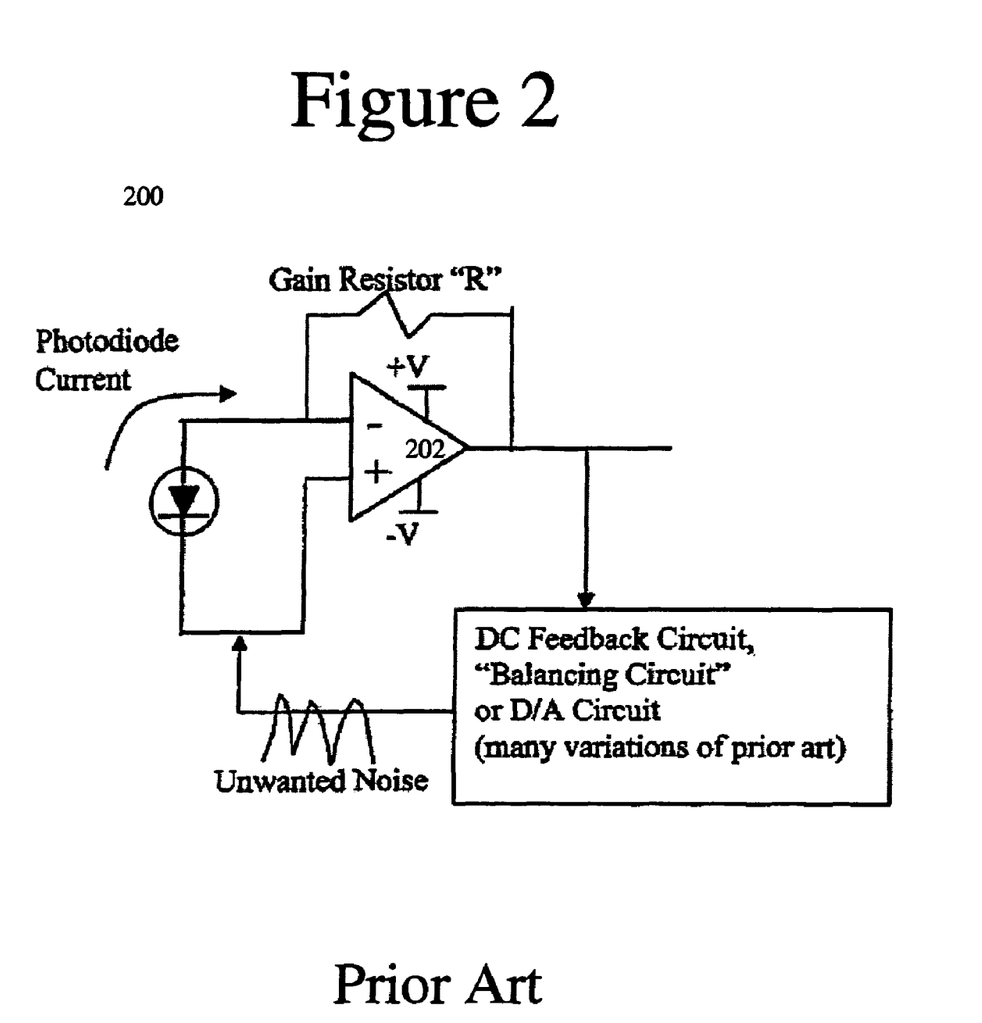
FIG. 2 is a block diagram of a basic photodiode amplification circuit with a feedback circuit.

Some photodiode amplification circuits have attempted to solve this issue by adding active feedback to dynamically change the Direct Current ("DC") operating point of the input (where the DC component is not of interest) with large signals. Referring to FIG. 2, a feedback circuit implementation 200 uses the output of an amplifier 202 to feed back a corrective DC signal to bring the input and output of the amplifier 202 within an acceptable operating range for the amplifier 202. However, this type of circuit allows undesirable noise to be fed back into the input of the amplifier 202. While a certain amount of filtering can be added, not all of the noise can be filtered out. All types of feedback systems may have sufficient frequency response, i.e. bandwidth, to perform a closed loop feedback function. The noise filter cannot be set inside the control loop bandwidth, or the control loop will not be effective in biasing the input circuit. Accordingly, a need exists for a device, method, and system for improving the signal to noise ratio of a photodiode amplifier with standard power supply voltages.

SUMMARY

The present invention is a novel device, system, and method for amplifying a photodiode. An exemplary embodiment, according to the present invention, may have a photodiode with an amplifier having an amplifier and a photodiode. The amplifier may have an inverting input, an amplifier non-inverting input, and an amplifier output. The photodiode may have a photodiode anode electrically connected with the amplifier inverting input and a photodiode cathode electrically connected with the amplifier non-inverting input. The photodiode amplifier may have a gain resistor coupling the amplifier inverting input with the amplifier output. The photodiode amplifier may also have a fixed voltage reference electrically connected with the photodiode cathode and the amplifier non-inverting output.

The photodiode amplifier may have one or more of the following features or objects. The fixed voltage reference may have a low pass filter. The fixed voltage reference with a low pass filter may be set substantially below a noise bandwidth of the photodiode amplifier. A voltage of the fixed voltage reference may be selected to bias the photodiode amplifier. The filter may be outside of the signal bandwidth of the photodiode amplifier. The photodiode anode may be electrically connected with the amplifier inverting input and produce an electrometer. An increase in the electrometer feedback resistance may increase a useable signal range of the photodiode amplifier by reducing the loading on the photodiode and by increasing gain without reducing SNR. The electrometer performance may be increased by increasing an electrometer gain. The gain resistor may be selected based upon a maximum available output signal range. The photodiode amplifier may be coupled to a low noise gain reduction circuit in order to match the signal range with a subsequent circuit stage. An analog to digital converter, or any other suitable circuit or device (e.g., an analog meter, an analog control system, etc.) may be coupled to the photodiode ampliflier output or to the low noise gain reduction circuit.

An alternative exemplary embodiment, according to the present invention, may have a method for amplifying a photodiode signal. The method may involve supplying an output of a fixed voltage reference with a low pass filter to a photodiode cathode and an amplifier non-inverting input. The method may also supply an output of a photodiode anode directly to an amplifier inverting input. The method may also direct an amplifier output through a feedback gain resistance to the amplifier inverting input. Actions similar to the device of the present invention may be features and objects of the exemplary method.

It is important to note that the present invention is not intended to be limited to a system or method which must satisfy one or more of any stated objects or features of the invention. It is also important to note that the present invention is not limited to the exemplary embodiments described herein. Modifications and substitutions by one of ordinary skill in the art are considered to be within the scope of the present invention, which is not to be limited except by the following claims.

BRIEF DESCRIPTION OF THE DRAWINGS

These and other features and advantages of the present invention will be better understood by reading the following detailed description, taken together with the drawings herein.

DETAILED DESCRIPTION

In the photodiode amplification circuit 100 of FIG. 1, amplifier 102 is in an inverting configuration. As previously discussed, the output of amplifier 102 will only go from 0 volts to a negative value. When using a standard power supply circuit of, for example, +/−15 volts (V), only half of the amplifier's output range is in use (ideally 0 to −15V). In operation, the amplifier's output range is further limited in use from 0 to −12V due to the limits of non-ideal amplifiers.

As was stated earlier, it is desirable to make R as large as is feasible. However, R sets the gain of the amplifier, hence directly setting the total linear output range of the amplifier. If the circuit had a ±∞ supply range, then R could be increased without any regard, and a significant SNR improvement may be seen. However, this may be impractical, as the type of operational amplifier suited for photodiode work may not tolerate in excess of +/−18V as an absolute worst case. With these tolerance margins involved, the typical range may be +/−15V. However, the range is not limited +/−15V, the invention may be implemented using a variety of supply voltages.

The exemplary photodiode amplifier, according to the present invention, may provide a device to increase the value of R in multiples and effectively utilize the amplifier output range without changing from +/−15V (or other) standard supplies, and/or without using custom amplifier implementations. The exemplary photodiode amplifier, according to the present invention, may not require a DC feedback loop, hence allowing the biasing circuit (precision reference) to be filtered thoroughly and without need of preserving a control loop bandwidth. This has the effect of limiting or preventing the addition of noise into the circuit.

Figure 3:
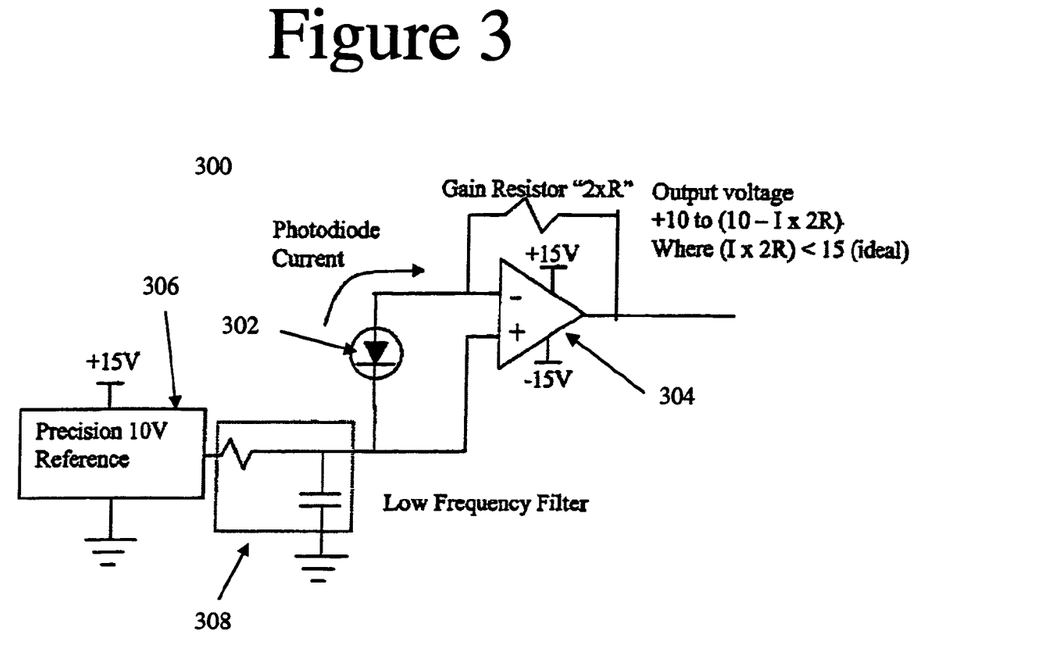
FIG. 3 is a block diagram of an exemplary photodiode amplification circuit according to the present invention.

Referring to FIG. 3, an exemplary photodiode amplification circuit 300, according to the present invention, may include photodiode 302 and amplifier 304. Photodiode amplification circuit 300 utilizes precision reference voltage supply 306 of 10 volts. It should be noted that although this example uses a precision reference of 10V other voltage values may be used. The 10 volts are added to photodiode amplification circuit 300 to bias photodiode 302 and amplifier 304 to an operating point close to the practical limit of the positive 15V supply of amplifier 304. As opposed to the prior art, photodiode amplification circuit 100 which may have a practical limit of 0 to −12V (theoretically 0 to −15V), the exemplary amplification circuit 300 may have twice as large of gain resistor "R" and a practical output signal range of +10V to −12V (theoretically +10V to −15V).

The amplification circuit 300 of the present invention may also include low frequency filter 308. Since any noise from reference voltage supply 306 will be seen directly on the output of reference voltage supply 306 and will be reflected in a reduction of SNR. In operation, low frequency filter 308 may be used to remove noise content within the signal band of interest, thus preventing or reducing SNR degradation. The limits of the low frequency filter may be selected based upon the desired bands utilized by photodiode 302.

Figure 4:
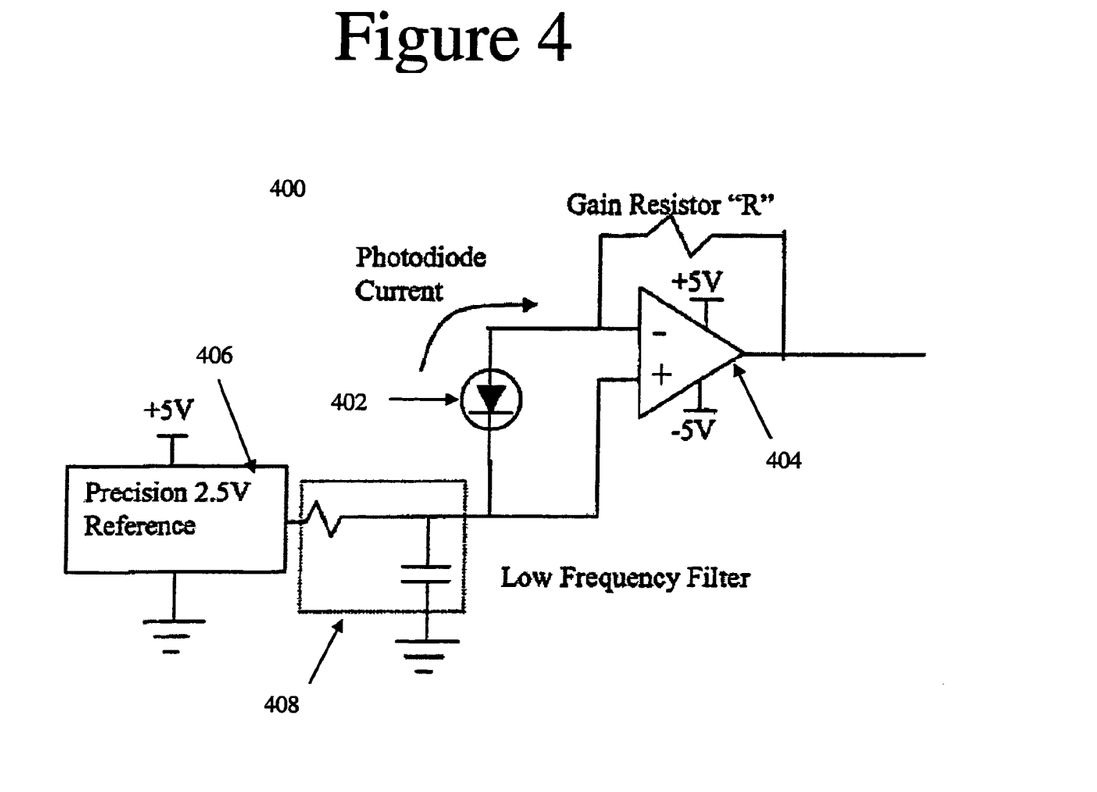
FIG. 4 is a block diagram of an exemplary low voltage photodiode amplification circuit according to the present invention.

Referring to FIG. 4, an exemplary low voltage photodiode amplification circuit 400, according to the present invention, may include photodiode 402 and amplifier 404. Photodiode amplification circuit 400 may also include precision reference voltage supply 406 of 2.5 volts. It should be noted that although this example uses a precision reference of 2.5V other voltage values may be used. The 2.5 volts are added to amplification circuit 400 to bias photodiode 402 and amplifier 404 to an operating point close to the practical limit of the positive 5V supply of amplifier 404. The exemplary photodiode amplification circuit 400 may also realize similar benefits to the previous exemplary amplification circuit 300.

Figure 5:
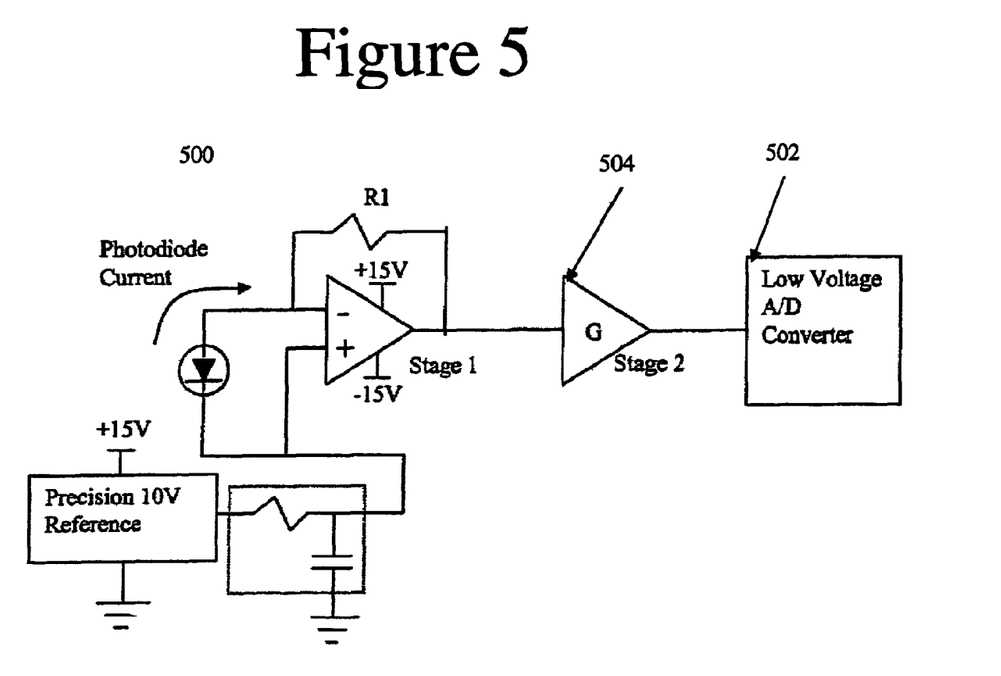
FIG. 5 is a block diagram of an exemplary photodiode amplification circuit implemented in a circuit according to the present invention.

Referring to FIG. 5, an exemplary photodiode amplification circuit implemented in circuit 500 may be used in conjunction with photodiode amplification circuit 300 and 400. Circuit 500 may include analog to digital (A/D) converter 502 to sample the output of the amplification circuit 300 and 400. It should be noted that the scope of this invention is not limited to the use of an A/D converter and that other devices may be implemented to replace or be used in conjunction with an A/D converter, such as a low noise gain reduction circuit coupled to an output of the photodiode amplifier, or any other suitable circuit or device (e.g., an analog meter, an analog control system, etc.).

For example, in order to match A/D converter 502 or other suitable circuit or device and to maximize the SNR of the photodiode amplification circuit 300 and 400; second stage amplification 504 may also be provided. The measurements of circuit 500 are provided in A/D counts Root Mean Square (RMS), where 1 count=1 Least Significant Bit (LSB) of the 24 bit A/D system, with $2^{24}$ total counts available.

Unfortunately, A/D converter 502 is also a noise contributor. However, A/D converter 502 noise floor effects can be accounted for by measuring its noise floor without any additional circuitry. This may be done by shorting the inputs of A/D converter 502, so that the only "signal" is noise from A/D converter 502. Noise from A/D converter 502 is then measured as the RMS value of the output of A/D converter 502. In operation, using a 24 bit A/D converter 502, the value was measured as 15 A/D counts RMS.

Circuit 500 maximizes the gain of the stage one amplifier for the best SNR. Circuit 500 then reduces the gain in stage two amplifier 504 in order to match A/D converter 502. Therefore, the noise effect of stage two amplifier 504 may be regarded as negligible. Below is a summarized analysis of stage amplifier 504 with a gain of .0.218.

Low Noise Second Stage OP Amp Noise Calculation

| OPA277 Input Noise Specification | Circuit parameters: |
|---|---|
| $Vn = 3nV\dfrac{1}{\sqrt{Hz}}$ | Bandwidth $(BW) = 50$ KHz |
| | $R1 = 10$ K |
| | $R2 = 10$ K |
| $In = 500 fA\dfrac{1}{\sqrt{Hz}}$ | $R3 = 2.1756$ K |
| | $R3 = 2.1756$ K |

OP Amp Noise is calculated $$\text{Total\_noise} = \sqrt{\left[\dfrac{Vn^2 + \left(\dfrac{In}{\dfrac{1}{R1}+\dfrac{1}{R2}}\right)^2 + (In \times R3)^2 +}{\left(\dfrac{1.6 \times 10^{-20}}{\dfrac{1}{R1}+\dfrac{1}{R2}}\right) + (1.6 \times 10^{-20} \times R3)}\right] \times BW}$$

Total OP AMP de-gain stage noise is $1.38 \times 10^{-6}$ volts RMS for 50 KHz Bandwidth, which is 4.631 counts RMS for a 24 bit A/D A/D noise floor is measured by shorting inputs together and taking data.

Result: 15 counts RMS A/D noise floor at 50 KHz bandwidth

Combined noise contribution of second stage OP amp and A/D noise floor:

$$\text{Total\_Noise} = \sqrt{(4.631^2 + 15^2)} = 15.699\_\text{Counts\_RMS}$$

The effect of stage two amplifier 504 is added to the noise floor of A/D converter 502 (using Root-Mean-Square), and the total noise floor is increased from 15 to 15.7.

Below is sample data taken for photodiode amplification circuit 300:

| Stage 1 Gain Resistor R | Stage 2 Gain G | Relative Gain | RMS Noise (counts) | RMS Noise with A/D and 2$^{nd}$ Stage Noise Mathematically Removed (counts) |
|---|---|---|---|---|
| Low Gain | 120 K Ohm | 0.3 | 1 | 31 | 27 |
| High Gain | 604 K Ohm | 0.3 | 5.03 | 120 | 119 |

Using the low gain as a baseline (relative gain=1), it would seem that making a 5.03 relative gain increase would take the noise of the low gain system=27 and result in a noise of 27×5.03=136. However, the actual noise of the high gain system is only 119, therefore demonstrating a 27 count RMS noise improvement with a higher level of sensitivity.

If the low gain was retained, and the second stage gain was increased instead (by a factor of 5) such that all of the first stage noise would be multiplied directly by a factor of five, the total noise would be 136 instead of the more desirable 119. Conversely, placing the gains the same, we would divide 119 by 5.03, for a result of 24 counts, as opposed to 27 counts (at ⅕ the signal level). Either way, the SNR improvement may be the same. In many cases, the actual signal is a very low value, i.e. close in magnitude to the noise, or SNR≈0, such that even seemingly small SNR improvements are very significant in the practical application. In this particular example, the SNR improvement is 20 Log$^{10}$ (noise1/noise2)=1.02 decibels (dB). Circuit 500 may be used to demonstrate a significant noise reduction provided by photodiode amplification circuit 300.

Figure 6:
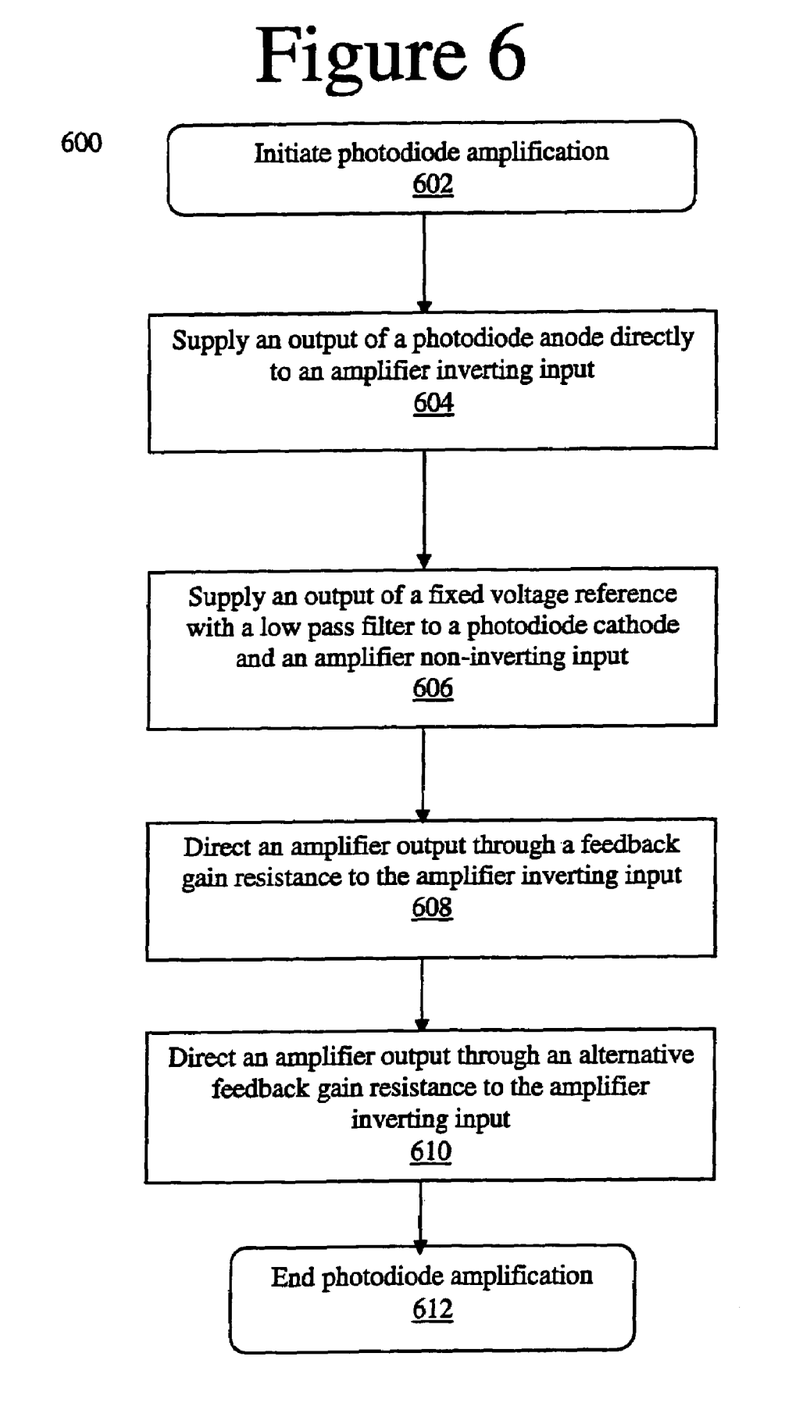
FIG. 6 is a flow chart of an exemplary photodiode amplification method according to the present invention.

Referring to FIG. 6, a flow chart illustrates an exemplary photodiode amplification method 600. The photodiode amplification process is initiated (block 602). Output of photodiode 302 or 402 anode is supplied directly to amplifier 304 and 404 inverting input respectively (block 604). An output of a fixed voltage reference 306 or 406 with low pass filter 308 or 408 is supplied to photodiode 302 or 402 cathode and an amplifier 304 or, 404 non-inverting input (block 604). The amplifier 304 or 404 output is directed through a feedback gain resistance "R" to amplifier 304 or 404 inverting input (block 606). The amplifier 304 or 404 output may be fed through an alternative feedback gain resistance to amplifier 304 or 404 inverting input (block 608). The amplification process is completed (block 610).

Figure 7:
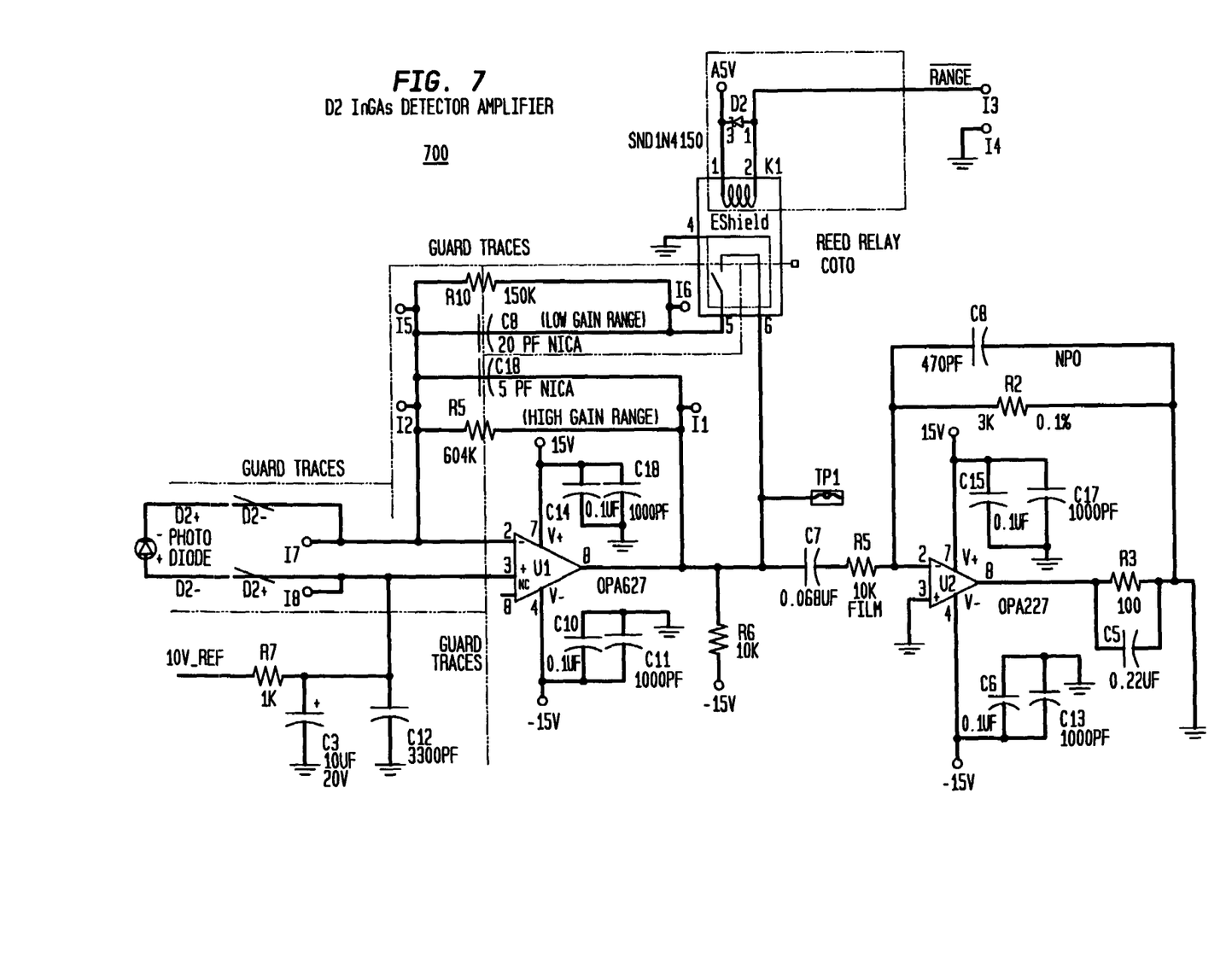
FIG. 7 is a first exemplary schematic diagram of photodiode amplification according to the present invention.
Figure 8:
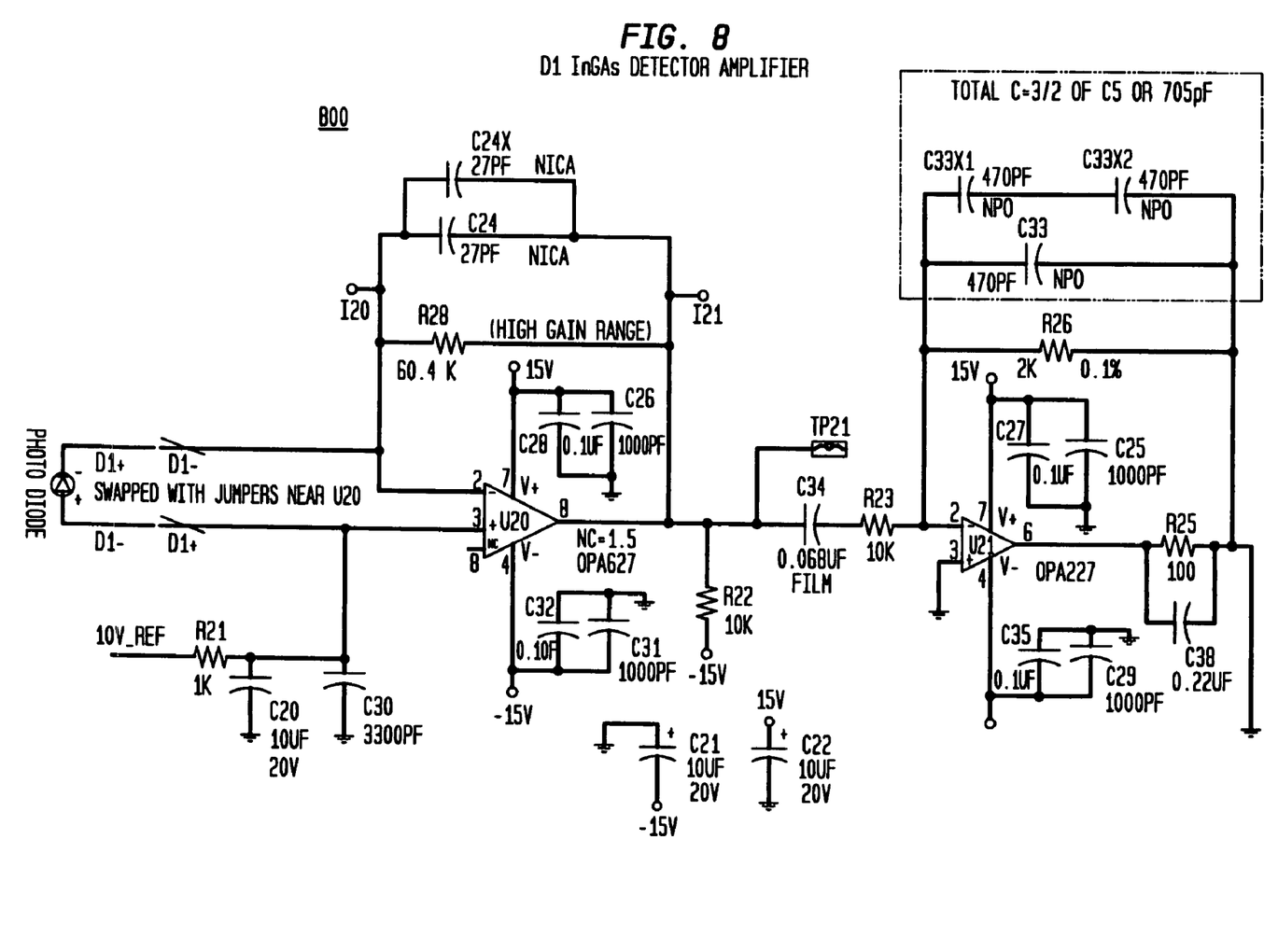
FIG. 8 is a second exemplary schematic diagram of photodiode amplification according to the present invention.
Figure 9:
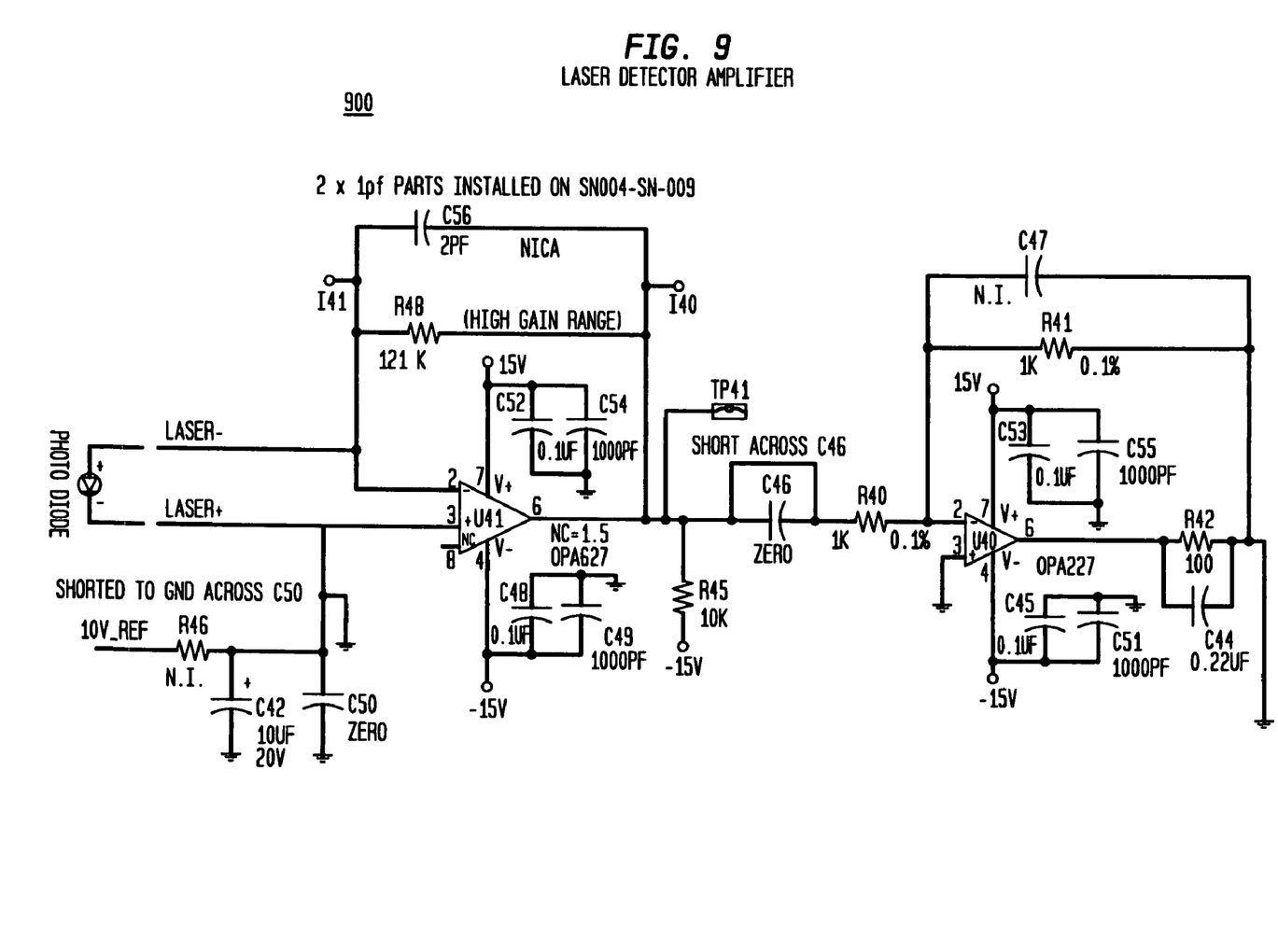
FIG. 9 is a third exemplary schematic diagram of photodiode amplification according to the present invention.

FIGS. 7, 8, and 9 provide exemplary schematic diagrams of photodiode amplification according to the present invention. FIGS. 7 and 8 provide and indium gallium arsenide photo detector circuits 700 and 800 respectively. FIG. 9 provides a laser detector circuit 900. The exemplary amplification circuit is not limited to these exemplary schematics. The exemplary amplification circuit and method may be utilized in a variety of other circuits.

Thus, devices, systems, and methods that allow for improving the signal to noise ratio of a photodiode amplifier with standard power supply voltages are provided. Moreover, it will be understood that the foregoing is only illustrative of the principles of the invention, and that various modifications can be made by those skilled in the art without departing from the scope and spirit of the invention.

Persons skilled in the art will appreciate that the present invention can be practiced by other than the described embodiments, which are presented for purposes of illustration rather than of limitation, and the present invention is limited only by the claims that follow.

What is claimed is:

1. A photodiode amplifier comprising: an amplifier having an amplifier inverting input, an amplifier non-inverting input, and an amplifier output;
   a photodiode having a photodiode anode electrically connected with the amplifier inverting input and a photodiode cathode electrically connected with the amplifier non-inverting input;
   a fixed voltage reference electrically connected with the photodiode cathode and the amplifier non-inverting input via a low pass filter;
   a gain resistor coupling the amplifier inverting input with the amplifier output wherein a value of the gain resistance is at least doubled by multiplying at least twice a reference voltage and dividing it by a diode current, which establishes a voltage gain which is substantially equal to a low limit of an amplification of the amplifier; and
   an analog to digital converter coupled to the amplifier output noise floor effects of the analog to digital converter accounted for via measuring a noise floor of the analog to digital converter by shorting inputs of the analog to digital converter.

2. The photodiode of claim 1, wherein the fixed voltage reference is directly electrically connected to the low pass filter and the low pass filter is directly electrically connected to the photodiode cathode.

3. The photodiode of claim 1, wherein the fixed voltage reference with the low pass filter is set substantially below a noise bandwidth of the photodiode amplifier.

4. The photodiode of claim 1, wherein a voltage of the fixed voltage reference is selected to bias the photodiode amplifier such that there is increase in a usable output of the photodiode amplifier.

5. The photodiode of claim 1, wherein the photodiode anode electrically connected with the amplifier inverting input forms an electrometer.

6. The photodiode of claim 1, further comprising: a second stage amplification, the analog to digital converter coupled to an output of the second stage amplification, the second stage amplification coupled to an output of the photodiode amplifier.

7. The photodiode of claim 1, further comprising: a low noise gain reduction circuit coupled to an output of the photodiode amplifier.

8. The photodiode of claim 1, further comprising: an alternative feedback resistor coupled in parallel with the gain resistor.

9. The photodiode of claim 2, wherein the low pass filter is outside of a signal bandwidth of the photodiode amplifier.

10. The photodiode of claim 5, wherein an increase in an electrometer gain increases a useable signal range of the photodiode amplifier without substantially increasing the signal to noise ratio within a circuit.

11. The photo diode of claim 5, wherein performance of the electrometer is increased by increasing an electrometer gain.

12. The photodiode of claim 5, wherein the gain resistor is selected based upon a maximum available output signal range.

13. A method of amplifying a photodiode output, comprising the steps of:
   supplying an output of a photodiode anode directly to an amplifier inverting input; supplying an output of a fixed voltage reference with a low pass filter to a photodiode cathode and an amplifier non-inverting input;
   directing an amplifier output through a feedback gain resistance wherein a value of the resistance is at least doubled by multiplying at least twice a reference voltage and dividing it by a diode current, which establishes a voltage gain which is substantially equal to a low limit of an amplification; and
   directing the amplifier output to an analog to digital converter, noise floor effects of the analog to digital converter accounted for via measuring a noise floor of the analog to digital converter by shorting inputs of the analog to digital converter.

14. The method of claim 13, wherein a voltage supplied by the fixed voltage reference with the low pass filter is set substantially below a noise bandwidth of a photodiode amplifier.

15. The method of claim 13, further comprising: selecting a voltage of the fixed voltage reference to bias a photodiode amplifier.

16. The method of claim 13, wherein the photodiode anode is connected directly to the amplifier inverting input to form an electrometer.

17. The method of claim 13, further comprising: supplying the output of the amplifier to a second stage amplification, the second stage amplification coupled to the analog to digital converter.

18. The method of claim 13, further comprising: directing the amplifier output through an alternative feedback gain resistance to the amplifier inverting input.

19. A photodiode amplifier comprising:
   an amplifier having an amplifier inverting input, an amplifier non-inverting input, and an amplifier output;
   a photodiode having a photodiode anode electrically connected with the amplifier inverting input and a photodiode cathode electrically connected with the amplifier non-inverting input; a gain resistor coupling the amplifier inverting input with the amplifier output wherein a value of a gain resistance is at least doubled by multiplying at least twice a reference voltage and dividing it by a current of the photodiode, which establishes a voltage gain which is substantially equal to a low limit of an amplification;
   a fixed voltage reference isolated from a amplifier power and electrically connected with the photodiode cathode and an amplifier non-inverting output;
   a low pass filter is electrically connected to the fixed voltage reference wherein the low pass filter is outside of a signal bandwidth of the photodiode amplifier; and
   an analog to digital converter coupled to amplifier output, noise floor effects of the analog to digital converter accounted for via measuring a noise floor of the analog to digital converter by shorting inputs of the analog to digital converter.

20. The photodiode of claim 19, wherein the photodiode anode is electrically connected with the amplifier inverting input to form an electrometer.

21. A method comprising:
   directing an output of an amplifier through a feedback gain resistance wherein a value of the feedback gain resistance is at least doubled by multiplying at least twice a reference voltage and dividing it by a diode current, which establishes a voltage gain which is substantially equal to a low limit of an amplification of the amplifier, an output of a photodiode anode supplied directly to an inverting input of the amplifier, an output of a fixed voltage reference with a low pass filter supplied to a photodiode cathode and a non-inverting input of the amplifier, the output of the amplifier supplied to a second stage amplification, the second stage amplification coupled to an analog to digital converter, noise floor effects of the analog to digital converter accounted for via a measurement a noise floor of the analog to digital converter, the noise floor measured by shorting inputs of the analog to digital converter.

* * * * *